(12) United States Patent
Fukazawa et al.

(10) Patent No.: US 12,489,461 B2
(45) Date of Patent: Dec. 2, 2025

(54) COMPRESSION DEVICE AND COMPRESSION METHOD

(71) Applicant: Kioxia Corporation, Tokyo (JP)

(72) Inventors: Youhei Fukazawa, Kawasaki Kanagawa (JP); Sho Kodama, Yokohama Kanagawa (JP); Keiri Nakanishi, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 256 days.

(21) Appl. No.: 18/208,745

(22) Filed: Jun. 12, 2023

(65) Prior Publication Data

US 2024/0106459 A1     Mar. 28, 2024

(30) Foreign Application Priority Data

Sep. 22, 2022   (JP) ................................. 2022-151121

(51) Int. Cl.
*H03M 7/34* (2006.01)
*H03M 7/30* (2006.01)

(52) U.S. Cl.
CPC ....... *H03M 7/3084* (2013.01); *H03M 7/3066* (2013.01)

(58) Field of Classification Search
CPC .... H03M 7/3086; H03M 7/3084; H03M 7/40; H03M 7/3088; H03M 7/42; H03M 7/6011; H03M 7/6023; H03M 7/3059; H03M 7/4037; H03M 7/6029; H03M 7/607; H03M 5/00; H03M 7/00; H03M 7/30; H03M 7/3079; H03M 7/4031; H03M 7/4093; H03M 7/6005; H03M 7/6017; H03M 7/6058; H03M 13/015; H03M 13/6569; H03M 7/3066; H03M 7/3082;
(Continued)

(56) References Cited

U.S. PATENT DOCUMENTS 6,735,670 B1 * 5/2004 Bronstein ............... H04L 69/22
                                                        365/49.1
8,766,827 B1 * 7/2014 Milne .................. H03M 7/3084
                                                        342/99
(Continued)

FOREIGN PATENT DOCUMENTS

JP        2010-098744 A       4/2010

OTHER PUBLICATIONS

J. Fowers et al., "A Scalable High-Bandwidth Architecture for Lossless Compression on FPGAs", 2015 IEEE 23rd Annual International Symposium on Field-Programmable Custom Computing Machines, 2015, pp. 52-59.

*Primary Examiner* — Linh V Nguyen
(74) *Attorney, Agent, or Firm* — Maier & Maier, PLLC

(57) ABSTRACT

According to one embodiment, a compression device includes a substring generator and a match information generator. The substring generator receives generates substrings which are stored in a memory. Byte positions of the substrings are different from each other. The match information generator determines a first string, at least part thereof matching at least part of one of the substrings, and outputs match information. The match information includes a position of the memory storing the first string and a length of the at least part of the first string matching the at least part of one of the substrings.

12 Claims, 13 Drawing Sheets

(58) Field of Classification Search
CPC ............ H03M 7/3091; H03M 7/3095; H03M 7/4006; H03M 7/4056; H03M 7/4062; H03M 7/425; H03M 7/6041; H03M 7/6047; H03M 7/6076; G06F 3/0608; G06F 3/0656; G06F 12/1018; G06F 3/0679; G06F 16/2255; G06F 2212/401; G06F 2212/7203; G06F 40/126; G06F 16/325; G06F 16/9014; G06F 16/9535
USPC ..................................................... 341/51, 87
See application file for complete search history.

(56) References Cited

U.S. PATENT DOCUMENTS

| | | | |
|---|---|---|---|
| 9,280,609 B2* | 3/2016 | Liu .................... | G06F 16/9014 |
| 9,419,648 B1* | 8/2016 | Guilford ............ | H03M 7/3086 |
| 9,473,168 B1* | 10/2016 | Gopal ................ | H03M 7/3086 |
| 9,584,155 B1* | 2/2017 | Gopal .................... | H03M 7/42 |
| 2003/0090397 A1 | 5/2003 | Rasmussen | |
| 2016/0283159 A1* | 9/2016 | Gopal ................... | G06F 3/0638 |
| 2017/0116280 A1 | 4/2017 | Shergill et al. | |
| 2021/0135685 A1* | 5/2021 | Kumar .................... | H03M 7/40 |
| 2021/0288662 A1* | 9/2021 | Fukazawa ............... | H03M 7/40 |
| 2021/0294500 A1* | 9/2021 | Kodama ................. | G06F 3/061 |
| 2022/0187994 A1* | 6/2022 | Fukazawa ........... | H03M 7/6029 |
| 2022/0255556 A1* | 8/2022 | Yashima ............. | G06F 12/0246 |

* cited by examiner

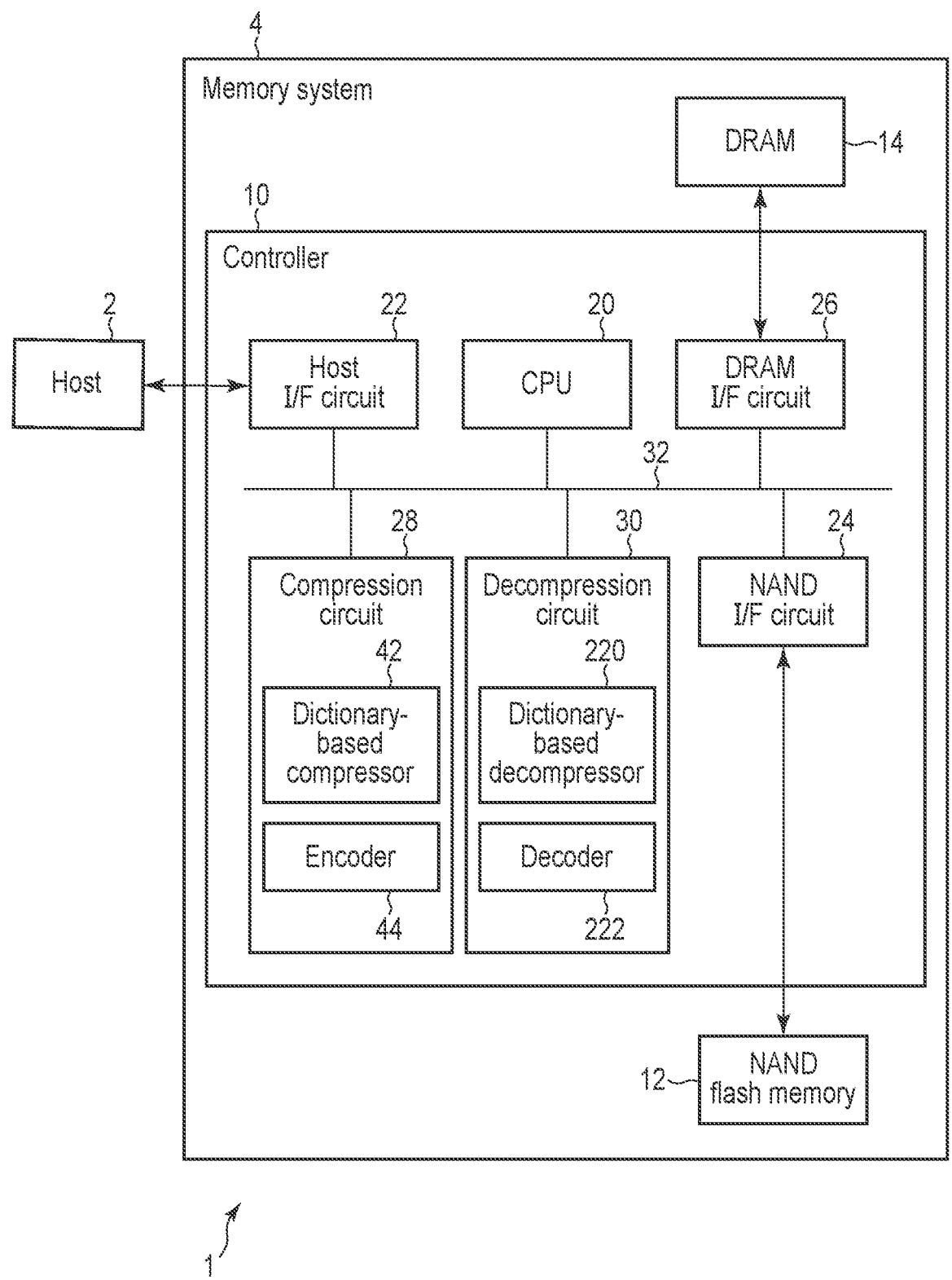
F I G. 1

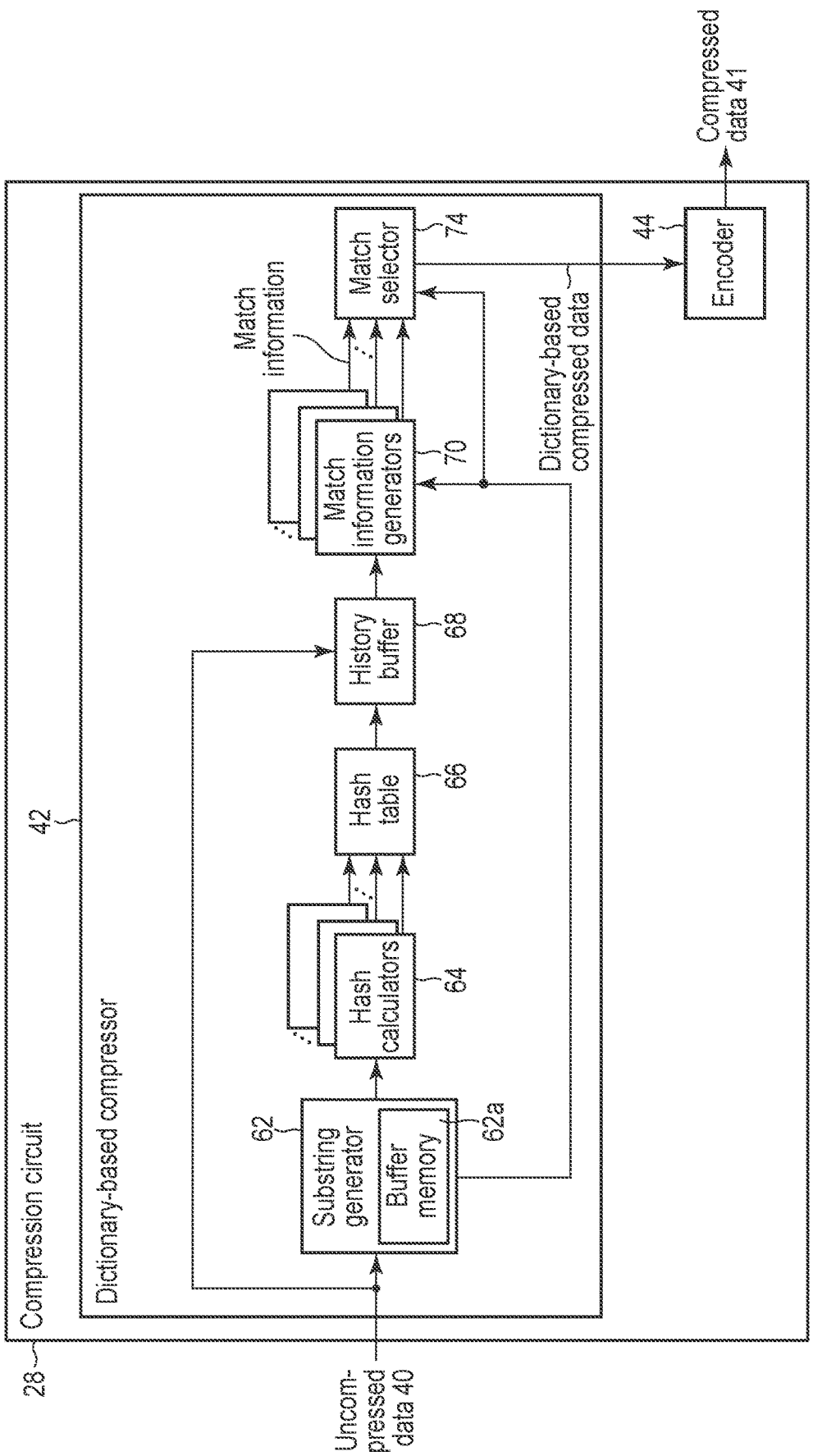
F I G. 2

| Cycle | C-1 | C | | | | | | | | | | | | | | | | C+1 | | | | | | | | | | | | | | |
|---|---|---|---|---|---|---|---|---|---|---|---|---|---|---|---|---|---|---|---|---|---|---|---|---|---|---|---|---|---|---|---|---|
| Index | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| Character string | | A | l | i | c | e | | w | a | s | | b | e | g | i | n | n | i | n | g | | t | o | | g | e | t | | v | e | r | y | |
| Substring | Match length | | | | | | | | | | | | | | | | | | | | | | | | | | | | | | | | |
| SS0 | 1 | A | | | | | | | | | | | | | | | | | | | | | | | | | | | | | | | * |
| SS1 | 4 | * | * | * | * | * | * | * | * | * | * | * | * | * | * | * | * | * | * | * | * | * | * | * | * | * | * | * | * | * | * | * | |
| SS2 | 16 | A | l | i | c | e | * | w | a | s | * | b | e | g | i | n | n | i | n | g | | | | | | | | | | | | |
| SS3 | 4 | | | c | e | * | | w | * | * | * | * | * | * | * | * | * | * | * | * | * | * | * | * | * | * | * | * | * | * | * | * | |
| SS4 | 1 | | | | e | | | | * | * | * | * | * | * | * | * | * | * | * | * | * | * | * | * | * | * | * | * | * | * | * | * | |
| SS5 | 7 | | | | | | | w | a | s | | b | e | g | i | n | * | * | * | * | * | * | * | * | * | * | * | * | * | * | * | * | |
| SS6 | 11 | | | | | | | | a | s | | b | e | g | i | n | n | i | n | g | | * | * | * | * | * | * | * | * | * | * | |
| SS7 | 5 | | | | | | | w | | s | | b | e | * | i | * | * | * | * | * | * | * | * | * | * | * | * | * | * | * | * | * | |
| SS8 | 6 | | | | | | | | | | | b | e | g | i | n | * | * | * | * | * | * | * | * | * | * | * | * | * | * | * | * | |
| SS9 | 4 | | | | | | | | | | | b | e | g | i | * | * | * | * | * | * | * | * | * | * | * | * | * | * | * | * | * | |
| SS10 | 4 | | | | | | | | | | | b | e | | i | n | * | * | * | * | * | * | * | * | * | * | * | * | * | * | * | * | |
| SS11 | 4 | | | | | | | | | | | | e | g | i | n | n | * | * | * | * | * | * | * | * | * | * | * | * | * | * | * | |
| SS12 | 6 | | | | | | | | | | | | | g | i | n | n | i | n | g | | | | | | | | | | | | |
| SS13 | 4 | | | | | | | | | | | | | | i | n | n | i | n | g | | | | | | | | | | | | |
| SS14 | 5 | | | | | | | | | | | | | | | n | n | i | n | g | | t | | | | | | | | | | |
| SS15 | 6 | | | | | | | | | | | | | | | n | n | i | n | g | | t | | | | | | | | | | |

| Cycle | C-1 | C | | | | | | | | | | C+1 | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|
| Index | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| Character string | | A | - | i | c | e | - | w | a | s | - | b | e | g | i | n | n | i | n | g | - | t | o | - | g | e | t | - | v | e | r | y | |
| Substring | Match length | | | | | | | | | | | | | | | | | | | | | | | | | | | | | | | | |
| SS0 (Carry-over SS) | 3 (Carry-over length) | d | A | - | i | | | | | | | | | | | | | | | | | | | | | | | | | | | | |
| SS1 | 1 | | A | * | * | * | * | * | * | * | * | * | * | * | * | * | * | * | * | * | * | * | * | * | * | * | * | * | * | * | * | * | * |
| SS2 | 4 | | | - | - | e | - | * | * | * | | | | | | | | | | | | | | | | | | | | | | | |
| SS3 | 16 | | | | c | e | - | w | a | s | - | b | e | g | i | n | n | i | n | g | * | | | | | | | | | | | | |
| SS4 | 4 | | | | | c | e | * | w | * | | b | e | * | * | * | * | * | * | * | | | | | | | | | | | | | |
| SS5 | 1 | | | | | e | - | * | * | * | | * | * | * | * | * | * | * | * | * | | | | | | | | | | | | | |
| SS6 | 7 | | | | | | | w | a | s | - | b | e | g | i | n | n | i | n | g | | | | | | | | | | | | | |
| SS7 | 11 | | | | | | | | w | a | s | b | e | g | i | n | n | i | n | g | * | t | | | | | | | | | | |
| SS8 | 5 | | | | | | | | | s | - | b | e | g | * | * | n | * | * | * | | | | | | | | | | | | | |
| SS9 | 6 | | | | | | | | | | - | b | e | g | i | n | * | * | * | * | | | | | | | | | | | | | |
| SS10 | 4 | | | | | | | | | | | b | e | g | i | n | * | * | * | * | | | | | | | | | | | | | |
| SS11 | 4 | | | | | | | | | | | b | e | g | i | n | n | * | * | * | | | | | | | | | | | | | |
| SS12 | 4 | | | | | | | | | | | b | e | g | | n | n | i | n | g | - | t | o | - | g | | | | | | | | |
| SS13 | 6 | | | | | | | | | | | | e | g | i | n | n | i | n | g | - | t | o | | | | | | | | | | |
| SS14 | 4 | | | | | | | | | | | | | g | i | n | n | i | n | g | - | t | o | - | g | e | * | * | * | * | * | * | |
| SS15 | 5 | | | | | | | | | | | | | | | n | n | i | n | g | - | t | o | - | g | e | * | * | * | * | * | * | |
| SS16 | 6 | | | | | | | | | | | | | | | | n | i | n | g | - | t | o | - | g | e | t | * | * | * | * | * | |

| Cycle | | | | C-1 | C | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|
| Index | | | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| Character string | | | | | A | l | l | | c | e | | w | a | s | | b | e | g | i | n | n | i | n | g | | t | o | | g | e | t | | v | e | r | y |
| Substring | Carry-over/ Match length | Selected/ Non-selected bit Vn | Determination bit (¦Sn&V¦) | | | | | | | | | | | | | | | | | | | | | | | | | | | | | | | | | |
| SS0 (Carry-over SS) | 3 (Carry-over length) | 1 | 1 | | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS1 | 1 | 0 | 1 | | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS2 | 4 | | | | 0 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS3 | 16 | | | | 0 | 0 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 |
| SS4 | 4 | | | | 0 | 0 | 0 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS5 | 1 | | | | 0 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS6 | 7 | | | | 0 | 0 | 0 | 0 | 0 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |
| SS7 | 11 | | | | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 |
| SS8 | 5 | | | | 0 | 0 | 0 | 0 | 0 | 0 | 0 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |
| SS9 | 6 | | | | 0 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| SS10 | 4 | | | | 0 | 0 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| SS11 | 4 | | | | 0 | 0 | 0 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| SS12 | 4 | | | | 0 | 0 | 0 | 0 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 0 | 0 | 0 | 0 | 0 | 0 |
| SS13 | 6 | | | | 0 | 0 | 0 | 0 | 0 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 | 0 | 0 | 0 |
| SS14 | 4 | | | | 0 | 0 | 0 | 0 | 0 | 0 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 0 | 0 | 0 | 0 |
| SS15 | 5 | | | | 0 | 0 | 0 | 0 | 0 | 0 | 0 | 0 | 0 | 0 | 0 | 0 | 0 | 0 | 1 | 1 | 1 | 1 | 1 | 1 | 0 | 0 | 0 | 0 | 0 | 0 | 0 | 0 | 0 | 0 | 0 | 0 |
| SS16 | 6 | | | | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 |

FIG. 12

| Cycle | | | C-1 | C | | | | | | | | | | | | | | | | C+1 | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|
| Index | | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| Character string | | | | A | l | i | c | e | | w | a | s | | b | e | g | i | n | n | i | n | g | | t | o | | g | e | t | | v | e | r | y | |
| Substring | Carry-over/ Match length | Selected/ Non-selected bit Vn | Determination bit (\|Sn&V) | | | | | | | | | | | | | | | | | | | | | | | | | | | | | | | | |
| SS0 (Carry-over SS) | 3 (Carry-over length) | | | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS2 | 4 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SS3 | 16 | 0 | 1 | 0 | 1 | 1 | 0 | 0 | 0 | 1 | 0 | 1 | 0 | 1 | 1 | 1 | 1 | 0 | 0 | 1 | 0 | 1 | 0 | 1 | 0 | 0 | 1 | 0 | 0 | 0 | 1 | 0 | 0 | 0 |
| SS4 | 4 | | | 0 | 0 | 0 | 1 | 1 | 0 | 0 | 1 | 1 | 1 | 0 | 0 | 0 | 0 | 1 | 1 | 0 | 0 | 0 | 0 | 0 | 0 | 0 | 0 | 1 | 0 | 0 | 0 | 0 | 0 | 0 | 0 |
| SS5 | 1 | | | 0 | 0 | 0 | 0 | 1 | 1 | 1 | 0 | 0 | 1 | 1 | 1 | 1 | 1 | 0 | 0 | 1 | 0 | 1 | 0 | 1 | 0 | 0 | 1 | 0 | 1 | 1 | 0 | 1 | 0 | 1 | 0 |
| SS6 | 7 | | | 0 | 0 | 0 | 0 | 0 | 1 | 1 | 1 | 1 | 1 | 1 | 1 | 1 | 1 | 1 | 1 | 1 | 1 | 1 | 1 | 1 | 0 | 1 | 1 | 0 | 1 | 1 | 0 | 0 | 0 | 0 | 0 |
| SS7 | 11 | | | 0 | 0 | 0 | 0 | 0 | 0 | 1 | 1 | 1 | 1 | 1 | 1 | 1 | 1 | 1 | 0 | 0 | 1 | 0 | 1 | 1 | 1 | 1 | 1 | 1 | 1 | 1 | 0 | 0 | 0 | 0 | 0 |
| SS8 | 5 | | | 0 | 0 | 0 | 0 | 0 | 0 | 0 | 1 | 1 | 1 | 1 | 1 | 1 | 1 | 0 | 1 | 1 | 1 | 1 | 1 | 1 | 1 | 1 | 1 | 1 | 1 | 1 | 1 | 0 | 0 | 0 | 0 |
| SS9 | 6 | | | 0 | 0 | 0 | 0 | 0 | 0 | 0 | 0 | 1 | 1 | 1 | 1 | 1 | 0 | 1 | 1 | 0 | 1 | 1 | 1 | 1 | 1 | 1 | 1 | 1 | 1 | 1 | 1 | 1 | 0 | 0 | 0 |
| SS10 | 4 | | | 0 | 0 | 0 | 0 | 0 | 0 | 0 | 0 | 0 | 1 | 1 | 1 | 0 | 1 | 1 | 0 | 1 | 0 | 1 | 1 | 1 | 1 | 1 | 1 | 1 | 1 | 1 | 1 | 1 | 1 | 0 | 0 |
| SS11 | 4 | | | 0 | 0 | 0 | 0 | 0 | 0 | 0 | 0 | 0 | 0 | 1 | 0 | 1 | 1 | 0 | 1 | 0 | 1 | 1 | 1 | 1 | 1 | 1 | 1 | 1 | 1 | 1 | 1 | 1 | 1 | 1 | 0 |
| SS12 | 4 | | | 0 | 0 | 0 | 0 | 0 | 0 | 0 | 0 | 0 | 0 | 0 | 1 | 1 | 0 | 1 | 0 | 1 | 1 | 1 | 1 | 1 | 1 | 1 | 1 | 1 | 1 | 1 | 1 | 1 | 1 | 1 | 1 |
| SS13 | 6 | | | 0 | 0 | 0 | 0 | 0 | 0 | 0 | 0 | 0 | 0 | 0 | 0 | 1 | 1 | 0 | 1 | 0 | 1 | 1 | 1 | 1 | 1 | 1 | 1 | 1 | 1 | 1 | 1 | 1 | 1 | 1 | 1 |
| SS14 | 4 | | | 0 | 0 | 0 | 0 | 0 | 0 | 0 | 0 | 0 | 0 | 0 | 0 | 0 | 1 | 0 | 0 | 1 | 1 | 1 | 1 | 1 | 1 | 1 | 1 | 1 | 1 | 1 | 1 | 1 | 1 | 1 | 1 |
| SS15 | 5 | | | 0 | 0 | 0 | 0 | 0 | 0 | 0 | 0 | 0 | 0 | 0 | 0 | 0 | 0 | 0 | 1 | 0 | 1 | 1 | 1 | 1 | 1 | 1 | 1 | 1 | 1 | 1 | 1 | 1 | 1 | 1 | 1 |
| SS16 | 6 | | | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |

F I G. 13

COMPRESSION DEVICE AND COMPRESSION METHOD

CROSS-REFERENCE TO RELATED APPLICATIONS

This application is based upon and claims the benefit of priority from Japanese Patent Application No. 2022-151121, filed Sep. 22, 2022, the entire contents of which are incorporated herein by reference.

FIELD

Embodiments described herein relate generally to a compression device and a compression method for compressing data.

BACKGROUND

If a large amount of data are stored as they were in a data center or the like, the capacity of a storage medium becomes enormous, and its associated costs increase.

To avoid this problem, data is compressed losslessly and the compressed data is stored to reduce the amount of data to be stored. An example of the lossless compression is a combination of dictionary-based compression and entropy coding. An example of the dictionary-based compression is "gzip" compression. The dictionary-based compression of "gzip" compression has a dictionary that stores a data string input in the past. The dictionary is searched for a data string that matches a data string to be compressed. If a data string that matches the data string to be compressed is stored in the dictionary, the data string to be compressed is converted into a set of information that the data string to be compressed has matched the data string stored in the dictionary, a storage position of the dictionary in which the matched data string is stored (referred to as a match position), and the length of the matched data string (referred to as a match length). If a past data string that matches the data string to be compressed is not stored in the dictionary, the data string to be compressed is converted into information that the data string to be compressed does not match the data string stored in the dictionary.

After the dictionary-based compression, the set of information that both the data strings has matched, match position, and match length or the information that both the data strings do not match is entropy-coded, and data is compressed to reduce the amount of data. The former information or the latter information is smaller in size than the data string to be compressed.

If the amount of data is reduced, the amount of data to be physically written to the storage medium is reduced, as is the amount of data to be physically read from the storage medium. It is therefore possible to increase the write speed and read speed and write more data to the storage medium.

In the dictionary-based compression, in order to increase compression/decompression throughput and compression performance, a dictionary may be searched simultaneously for a plurality of data strings that are shifted by one data item from the leading part of the data string to be compressed. In this case, a plurality of data strings that match the data string to be compressed may be detected.

In a case of text compression, if a plurality of character strings that match the data string to be compressed are detected, a plurality of character strings that do not include equal character strings have to be selected from the detected character strings. This selection is a time-consuming process.

BRIEF DESCRIPTION OF THE DRAWINGS

FIG. 1 is a block diagram illustrating an example of an information processing system according to an embodiment.

FIG. 2 is a block diagram illustrating an example of the compression circuit according to the embodiment.

FIG. 5 is a diagram illustrating an example of a dictionary match character string for each substring according to the embodiment.

FIG. 6 is a diagram illustrating an example of selection of match information according to the embodiment.

FIG. 9 is a diagram illustrating an example of a bitmap of match information generated by the bit map generator according to the embodiment.

FIG. 11 shows the status of a bit string and a determination bit in determining whether or not to select match information of a first substring.

FIG. 12 shows the status of a bit string and a determination bit in determining whether or not to select match information of a second substring.

FIG. 13 shows the status of a bit string and a determination bit in determining whether or not to select match information of a fourth substring.

DETAILED DESCRIPTION

Figure 3:
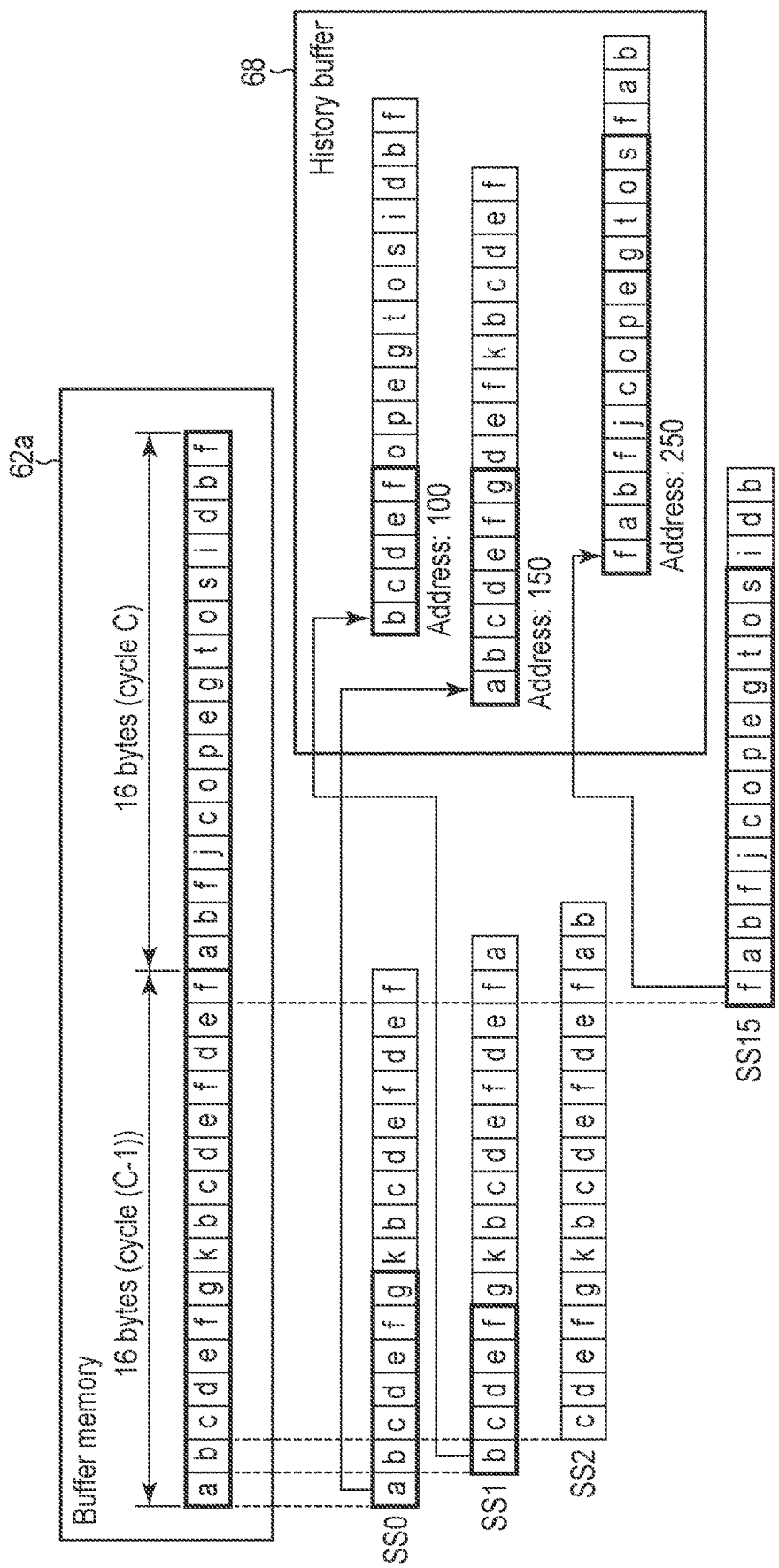
FIG. 3 is a diagram illustrating an example of generation of the substrings according to the embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a compression device comprises a substring generator, a memory, a match information generator, and a selector. The substring generator is configured to receive data strings for cycles, a data string per cycle having certain bytes, and generate substrings from the data strings, each of the substrings having the certain bytes, each of the substrings including different byte data, leading byte positions of different byte data of the substrings being different from each other. The memory is configured to store the data strings for cycles. The match information generator is configured to determine first data strings in the data strings stored in the memory, at least part of the first data string matching at least part of the substring, and generate match information items, the match information item including a position of the memory storing the first data string and a length of the part of the first data string matching the part of the substring. The selector is configured to determine whether to select a second item of the match information items based on bitmaps of the match information items and a bit string representing whether a first item of the match information items is selected.

FIG. 1 is a block diagram illustrating an example of an information processing system 1 according to an embodiment. The information processing system 1 includes a host 2 and a memory system 4.

The host 2 is an information processing device that accesses the memory system 4. The memory system 4 can be used as the main storage of the host 2. The memory system 4 may be built into the host 2 or provided outside the host 2 and connected to the host 2 by a cable or a network. The host 2 may be a server (storage server) that stores a large amount and a variety of data in the memory system 4. The host 2 may be a personal computer. The memory system 4 may be a business-use system incorporated into a server such as a data center. The memory system 4 may be a personal-use system incorporated into a personal computer. Examples of the memory system 4 are a solid state drive (SSD) and a hard disk drive (HDD). In the following description, the SSD is an example of the memory system 4.

The memory system 4 includes a NAND flash memory 12, a dynamic random access memory (DRAM) 14, and a controller 10.

The NAND flash memory 12 is an example of a nonvolatile memory. Instead of the NAND flash memory 12, a NOR flash memory, a magneto-resistive random access memory (MRAM), a phase change random access memory (PRAM), a resistive random access memory (ReRAM), and a ferroelectric random access memory (FeRAM) can be used. The NAND flash memory 12 includes a memory cell array containing a plurality of memory cells arranged in a matrix. The memory cell array may have a two-dimensional structure or a three-dimensional structure.

The DRAM 14 is an example of a volatile memory. The DRAM 14 is, for example, a DRAM of the double data rate 3 low voltage (DDR3L) standard. The DRAM 14 includes a write buffer, a read buffer, a management information buffer, and the like. The write buffer stores data which is transmitted from the host 2 to the memory system 4 and which is being written to the NAND flash memory 12 or is not being written thereto. The read buffer stores data which is read from the NAND flash memory 12 and which is being transmitted to the host 2 or is not transmitted thereto. The management information buffer stores various tables, various values, and a lookup table which are used during the operation of the memory system 4. The DRAM 14 also functions as a temporary buffer for software to be executed in the controller 10. The DRAM 14 may be provided inside the controller 10 as well as outside the controller 10. As a volatile memory, a static random access memory (SRAM) capable of quicker access may be used instead of the DRAM 14.

The controller 10 is configured to write data to the NAND flash memory 12 or read data from the NAND flash memory 12 in accordance with a command transmitted from the host 2. The controller 10 can be configured by a circuit such as a system on a chip (SoC). The controller 10 has a function of controlling the operation of the memory system 4. The controller 10 includes a host interface (referred to as a host I/F circuit) 22, a CPU 20, a NAND interface (referred to as a NAND I/F circuit) 24, a DRAM interface (referred to as a DRAM I/F circuit) 26, a compression circuit 28, and a decompression circuit 30.

The host I/F circuit 22 is configured to perform communications with the host 2. The communications with the host 2 conform to the PCI Express™ standard, for example. The host I/F circuit 22 receives commands from the host 2.

The NAND I/F circuit 24 is a memory control circuit configured to control the NAND flash memory 12 under the control of the CPU 20. The NAND I/F circuit 24 and NAND flash memory 12 are connected by a plurality of channels Ch. The NAND flash memory 12 includes a number of memory chips. Plural memory chips are connected to a channel Ch.

The DRAM I/F circuit 26 is a DRAM control circuit configured to control the DRAM 14 under the control of the CPU 20.

The compression circuit 28 includes a dictionary-based compressor 42 and an encoder 44. The dictionary-based compressor 42 is a data compression circuit which performs dictionary-based compression for uncompressed data. The encoder 44 encodes compressed data output from the dictionary-based compressor 42.

The controller 10 compresses the uncompressed data, which is transmitted from the host 2, by means of the compression circuit 28 and writes the compressed data to the NAND flash memory 12 by means of the NAND I/F circuit 24. The controller 10 may write the compressed data to the NAND flash memory 12 after performing a predetermined process such as error-correction coding and randomizing on the compressed data. That is, the controller 10 is configured to write data based on the compressed data output from the compression circuit 28 to the NAND flash memory 12 by means of the NAND I/F circuit 24. The controller 10 decompresses the compressed data, which is read from the NAND flash memory 12, by means of the decompression circuit 30 and transmits it to the host 2 by means of the host I/F circuit 22. The controller 10 may cause the decompression circuit 30 to decompress the read data after performing a predetermined process such as error correction and randomization release on the read data. That is, the controller 10 is configured to decompress the data based on the data read from the NAND flash memory 12 by means of the decompression circuit 30 and transmit it to the host 2.

The decompression circuit 30 includes a dictionary-based decompressor 220 and a decoder 222.

Since the compression circuit 28 and the decompression circuit 30 are included in the controller 10, they are each implemented by a dedicated circuit (SoC). However, the compression circuit 28 and decompression circuit 30 may be implemented by the CPU 20 executing compression or decompression programs (firmware). Although the compression circuit 28 and decompression circuit 30 have been described as being incorporated in the controller 10 of the memory system 4, one or both of the circuits 28 and 30 may be provided outside the memory system 4. The outside of the memory system 4 is, for example, a host or a server to which the host is further connected.

FIG. 2 is a block diagram illustrating an example of the compression circuit 28 according to the embodiment.

The dictionary-based compressor 42 includes a substring generator 62, hash calculators 64, a hash table 66, a history buffer 68, match information generators 70, and a match selector 74. The substring generator 62 includes a buffer memory 62a.

The hash calculators 64, hash table 66, history buffer 68, and match information generators 70 are configured to process a plurality of substrings, which are obtained from uncompressed data 40, in parallel. This configuration improves throughput.

Below is an example in which the number of substrings processed in parallel is N. The symbol N represents a positive integer equal to or greater than 2.

FIG. 3 is a diagram illustrating an example of generation of the substrings according to the embodiment. The substring generator 62 includes the buffer memory 62*a*. The buffer memory 62*a* stores 2-cycle uncompressed data. One address is allocated to an area of the buffer memory 62*a* storing 1-byte data. In the embodiment, the 1-cycle uncompressed data is 16-byte data. The uncompressed data may be any character data, image data, etc. In the following description, the uncompressed data is character data.

The 16-byte uncompressed character string "abcdefgkbcdefdef" input in cycle (C−1) is stored in address 0 through address 15 of the buffer memory 62*a*. The 16-byte uncompressed character string "abfjcopegtosidbf" input in cycle C is stored in address 16 through address 31 of the buffer memory 62*a*.

The substring generator 62 reads the 16-byte character string "abcdefgkbcdefdef" from address 0 through address 15 of the buffer memory 62*a*, and sets the read character string as a 0-th substring SS0. The SS0 includes a character string input in the cycle (C−1).

The substring generator 62 reads the 16-byte character string "bcdefgkbcdefa" from address 1 through address 16 of the buffer memory 62*a*, and sets the read character string as a first substring SS1. The first substring SS1 includes a character string input in the cycle (C−1) and a character string input in the cycle C. The byte position of the first character "b" of the first substring SS1 differs from the byte position of the first character "a" of the 0-th substring SS0 by one in the character string and in the address of the buffer memory 62*a*. The byte position of the first character of a substring is also referred to as a head of the substring. That is, the address of the head of the first substring SS1 is shifted by one from the address of the head of the 0-th substring SS0 in the character string of uncompressed data.

Similarly, the substring generator 62 reads a 16-byte character string from the addresses shifted one by one in the buffer memory 62*a* and sets the read character string as a substring. Finally, the substring generator 62 reads a 16-byte character string "fabfjcopegtosidb" from address 15 through address 30 of the buffer memory 62*a*, and sets the read character string as a fifteenth substring SS15.

Returning to FIG. 2, in a case where N (N=16 in the example of FIG. 3) substrings are processed in parallel, the dictionary-based compressor 42 includes N hash calculators 64 and N match information generators 70. An i-th hash calculator 64 in the N hash calculators 64 processes an i-th substring. The symbol "i" represents a number from 0 to (N−1) (0 to 15 in the example of FIG. 3). The i-th hash calculator 64 will be represented as a hash calculator 64-*i*. An i-th match information generator 70 in the N match information generators 70 processes the i-th substring. The i-th match information generator 70 will be represented as a match information generator 70-*i*.

Each of the N hash calculators 64 calculates a hash value of each of the N substrings. For the calculation of the hash value, a single predetermined hash function and at least part of the substring are used. Each of the N hash calculators 64 transmits the calculated hash value to the hash table 66.

More specifically, the i-th hash calculator 64-*i* calculates a hash value of the i-th substring. The hash calculator 64-*i* transmits the calculated hash value to the hash table 66.

The hash table 66 is implemented by a volatile memory, for example. The hash table 66 includes a plurality of storage areas. Each of the storage areas is capable of storing data associated with a single hash value. The data associated with the single hash value, for example, identifies a storage area in the history buffer 68. The data that identifies a storage area in the history buffer 68 is, for example, an address. Data stored in the storage areas of the history buffer 68 can be read in parallel.

The hash value of a substring functions as an address of the storage area in the hash table 66. The hash table 66 identify a storage area in the history buffer 88 using, as an address, the hash value of the N substring calculated by the hash calculator 64.

If the hash table 66 stores an address of the history buffer 68, the address is read from the hash table 66. Then, a data read request including the read address is transmitted to the history buffer 68. Upon the data read request, the history buffer 68 reads data from the storage area identified by the read address. If the hash table 66 does not store the address of the history buffer 68, the data read request is not transmitted to the history buffer 68.

Below is an example where N data read requests are transmitted in parallel to the history buffer 68 by using the hash values of N substrings respectively calculated by the N hash calculators 64.

The history buffer 68 is implemented by an SRAM, for example. The history buffer 68 may be implemented by a flip-flop circuit. The history buffer 68 is also referred to as a dictionary buffer. The history buffer 68 stores a predetermined number of character strings that were input to the dictionary-based compressor 42.

In the history buffer 68, a character string is read from a storage area identified by the read address of the data read request. The read character string is compared with a substring corresponding to the data read request. The character string read from the history buffer 68, which is compared with the substring, is also referred to as a dictionary match candidate corresponding to the substring. The dictionary match candidate is transmitted to the match information generator 70 corresponding to the substring. The substrings are transmitted from the substring generator 62 to the match information generators 70.

Each of the N match information generators 70 generates match information of the corresponding substring. Each of the N match information generators 70 transmits the match information to the match selector 74. A substring is transmitted from the substring generator 62 to the match information generator 70 corresponding to the substring.

The match information represents a result of a search process to determine whether at least leading part of the dictionary match candidate matches at least leading part of the substring. The match information includes a match flag, a match position, and a match length.

The match flag represents whether the history buffer 68 stores a character string whose at least leading part matches at least leading part of the substring. The character string whose at least leading part matches at least leading part of the substring is referred to as a dictionary match character string. If the history buffer 68 stores the dictionary match character string, that is, the history buffer 68 stores the character string whose at least leading part matches at least leading part of the substring, the match flag is a character string "match" representing a match. If the history buffer 68 does not store the dictionary match character string, that is, the history buffer 68 does not store the character string whose at least leading part matches at least leading part of the substring, the match flag is character string "mismatch" representing a mismatch.

If the match flag is "match" (or if the history buffer 68 stores the dictionary match character string), the match position represents a distance from a position of the history buffer 68 storing the substring and to a position of the history buffer 68 storing the dictionary match character string corresponding to the substring. This distance corresponds to a difference in addresses representing a storage position of the history buffer 68. If the match flag is "mismatch" (or if the history buffer 68 does not store the dictionary match character string), no value is set to the match position.

If the match flag is "match", the match length represents the byte length of matching part between the substring and the corresponding dictionary match character string. If the match flag is "mismatch", no value is set to the match length.

Match information including match flag "match", match position D, and match length L will be represented as match(D, L). Match information including the match flag "mismatch" will be represented as MM. Match information corresponding to the i-th substring will be represented as match information M[i].

Here are descriptions of a specific operation of the i-th match information generator 70-$i$ in the case where the dictionary match candidate corresponding to the i-th substring is transmitted from the history buffer 68 to the match information generator 70-$i$ and that in the case where the dictionary match candidate is not transmitted from the history buffer 68 to the match information generator 70-$i$.

First is a description of a case where the dictionary match candidate corresponding to the i-th substring is transmitted from the history buffer 68 to the match information generator 70-$i$. In this case, the match information generator 70-$i$ compares the i-th substring and the dictionary match candidate to generate i-th match information M[i]. Specifically, if at least leading part of the dictionary match candidate matches at least leading part of the i-th substring, the match information generator 70-$i$ generates match information M[i] (that is, match(D, L)) including match flag "match", match position D, and match length L. If at least leading part of the dictionary match candidate does not match the i-th substring, the match information generator 70-$i$ generates match information M[i] (that is, MM) including the match flag "mismatch". Then, the match information generator 70-$i$ transmits the generated match information M[i] to the match selector 74.

Next is a description of a case where the dictionary match candidate corresponding to the i-th substring is not transmitted to the match information generator 70-$i$. In this case, the match information generator 70-$i$ generates match information M[i] (that is, MM) including the match flag "mismatch". Then, the match information generator 70-$i$ transmits the generated match information M[i] to the match selector 74.

With the foregoing configuration, the N match information generators 70 send N items of match information M[0] to M[N−1] corresponding to the N substrings to the match selector 74 in parallel.

Figure 4:
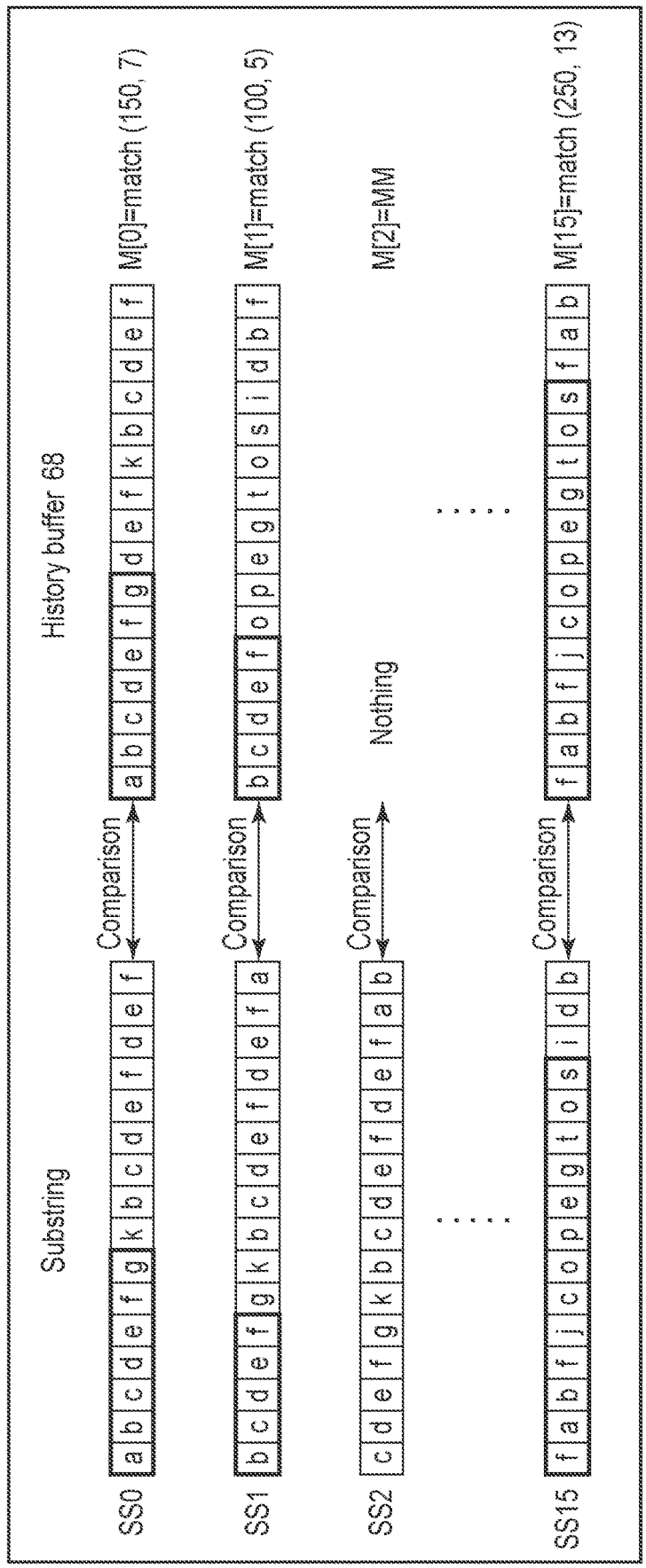
FIG. 4 is a diagram illustrating an example of the match information according to the embodiment.

FIG. 4 is a diagram illustrating an example of the match information M[i] according to the embodiment. As shown in FIG. 3, the match information generator 70 determines, among the character strings in the history buffer 68, a character string of which at least leading part matches at least leading part of the substring.

A character string "abcdefgdefkbcdef" stored in the address 150 of the history buffer 68 is detected as the character string whose at least leading part matches at least leading part of the 0-th substring SS0 "abcdefgkbcdefdef". The first seven bytes of both the character strings match. Assume that the 0-th substring SS0 is stored in a reference address of the history buffer 68, e.g., address 0. Match information M[0] of the 0-th substring SS0 is match(150, 7).

A character string "bcdefopegtosidbf" stored in the address 100 of the history buffer 68 is detected as the character string whose at least leading part matches at least leading part of the first substring SS1 "bcdefgkbcdefdefa". The first five bytes of both the character strings match. Assume that the first substring SS1 is stored in the reference address of the history buffer 68, e.g., address 0. Match information M[1] of the first substring SS1 is match(100, 5).

The history buffer 68 does not store the character string whose at least leading part matches the second substring SS2 "cdefgkbcdefdefab". Match information M[2] of the second substring SS2 is MM.

A character string "fabfjcopegtosfab" stored in the address 250 of the history buffer 68 is detected as the character string whose at least leading part matches at least leading part of the fifteenth substring SS15 "fabfjcopegtosidb". The first 13 bytes of both the character strings match. Assume that the fifteenth substring SS15 is stored in the reference address of the history buffer 68, e.g., address 0. Match information M[15] of the fifteenth substring SS15 is match(250, 13).

Returning to FIG. 2, the match selector 74 selects one item of match information corresponding to each character of the uncompressed data 40 from the match information M[0] to M[N−1] regarding N substrings SS0 to SS(N−1).

The match selector 74 selects match information corresponding to a character in order from the first character of the character string. The match selector 74 transmits data based on the selected match information to the encoder 44. Data based on the selected match information will be referred to as dictionary-based compressed data. The dictionary-based compressed data includes data of a plurality of symbols (that is, a symbol string). Each of the symbols is one of a match position symbol, a match length symbol, and a match/mismatch flag.

The encoder 44 encodes for the dictionary-based compressed data to generate compressed data 41. An example of the coding of the encoder 44 is entropy coding such as Huffman coding. The entropy coding is a variable-length coding scheme for generating a code table (coding table) dynamically using the frequency of occurrence of a symbol to be coded. The entropy coding is defined by, for example, "deflate" or "gzip". The coding table includes information representing N different symbols and N code words respectively associated with the N symbols. In the entropy coding, a symbol whose occurrence frequency is high is assigned a short code word and a symbol whose occurrence frequency is low is assigned a long code word. In accordance with this assignment, the encoder 44 converts an input symbol into a code word. In other words, a code word obtained by the conversion is a variable-length code. Note that the symbols are fixed-length data. The compressed data 41 generated by the entropy coding includes code words into which a plurality of symbols included in the dictionary-based compressed data are converted. The compressed data 41 may further include as a header data identifying a coding table used for entropy coding. The data identifying the coding table is used to restore the coding table (decoding table) when the compressed data 41 is decompressed.

With the above configuration, the compression circuit 28 can compress the uncompressed data 40 to generate compressed data 41. If the uncompressed data is, for example, data that is requested by the host 2, to be written to the NAND flash memory 12, the CPU writes the compressed data 41 to the NAND flash memory 12 by the NAND I/F circuit 24.

The controller 10 may further include an ECC encoder and an ECC decoder. The ECC encoder generates error-correcting code parity (ECC parity) for the compressed data 41 output from the encoder 44 and generates a code word having the generated ECC parity and the compressed data 41. The CPU 20 is configured to write the code word to the NAND flash memory 12 by the NAND I/F circuit 24. That is, the CPU 20 is configured to write data, which is based on the compressed data 41 output from the compression circuit 28, to the NAND flash memory 12 by the NAND I/F circuit 24. Upon receiving a read command from, for example, the host 2 by the host I/F circuit 22, the CPU 20 reads data, which is specified by the read command, from the NAND flash memory 12 by the NAND I/F circuit 24. The ECC decoder performs an error correction process on the read data. The read data for which an error correction process has been performed is input as compressed data 41 by the CPU 20 to the decompression circuit 30. The decompression circuit 30 decompresses the input compressed data 41. The CPU 20 transmits the decompressed data to the host 2 in response to the read command from the host 2. That is, the CPU 20 is configured to decompress data based on data read from the NAND flash memory 12 and transmit the decompressed data to the host 2 in response to the read command from the host 2.

The match selector 74 will be described in detail. Below is a description of match selection made when the match selector 74 receives a character string of 16 bytes (16 characters) in one cycle. As shown in FIG. 3, 16 substrings are generated for one-cycle uncompressed data. The match selector 74 selects at least one item of match information corresponding to each character of the character string that is uncompressed data 40, from match information M[0] to M[15] of the 16 substrings.

FIG. 5 is a diagram illustrating an example of a dictionary match character string for each substring according to the embodiment. The substring generator 62 generates 16 substrings SS0 to SS15 with different start positions from a 16-byte character string "Alice was beginn" input in the cycle C and a 16-byte character string "ing to get very" input in the cycle (C+1). The substring generator 62 transmits substrings SS0 to SS15 to the match information generator 70 and match selector 74.

The match information generator 70 searches the history buffer 68 for a dictionary match character string whose at least leading part matches at least leading part of each of the substrings SS0 to SS15. Assume that the dictionary match character strings matching the substrings SS0 to SS15 are stored in the history buffer 68. That is, assume that all items of match information M[0] to M[15] are match(D, L).

In FIG. 5, an underscore symbol "_" represents a matched space.

The match information generator 70 detects among the dictionary match candidates a dictionary match character string "A***************" whose at least leading part matches a leading part of the substring SS0 "Alice_was_be-ginn". A symbol "*" represents a mismatched character. The match length of match information M[0] of the substring SS0 is 1.

The match information generator 70 detects among the dictionary match candidates a dictionary match character string "lice************" whose at least leading part matches a leading part of the first substring SS1 "lice_was-_beginni". The match length of match information M[1] of the first substring SS1 is 4. The match information generator 70 detects among the dictionary match candidates a dictionary match character string "ice_was_beginnin" which completely match the substring SS2 "ice_was_beginnin". The match length of the match information M[2] of the substring SS2 is 16.

By performing a process as described above, the match information generator 70 detects among the dictionary match candidates a dictionary match character string "ning_t**********" at least leading part of which matches a leading part of substring SS15 "ning_to_get_very". The match length of match information M[15] of substring SS15 is 6.

Assume that some of the 16 substrings, for example, match information of the substring SS0, SS1, and SS2, are selected. The dictionary match character string of the first substring SS1 is "lice_was_beginni" and that of the substring SS2 is "ice_was_beginni". The character string "ice" is included in both the dictionary match character string of the first substring SS1 and that of the second substring SS2 in duplicate. Therefore, when the uncompressed data is converted into the match information of the substrings SS0, SS1, and SS2 and thus compressed, if the compressed character string is decompressed, a character string "Alice-ice was beginnin" is generated and the uncompressed data cannot correctly be restored.

The match selector 74 selects match information such that character strings to be compressed do not overlap. Overlapping character strings is referred to as a conflict of character strings.

FIG. 6 is a diagram illustrating an example of selection of match information according to the embodiment. FIG. 6 shows an example of selecting match information to avoid a conflict of character strings. The example of the dictionary match character strings shown in FIG. 6 is the same as the example in FIG. 5. However, in FIG. 5, the 16 substrings generated from the 32-byte character string input in the cycle C and the cycle (C+1) are referred to as substring SS0 to SS15, whereas in FIG. 6, the 16 substrings generated from the 32-byte character string input in the cycle C and the cycle (C+1) are referred to as substring SS1 to SS16. In FIG. 6, substring SS0 corresponding to the match information selected in the cycle (C−1) is also used to select match information.

The substring generator 62 generates 16 substrings SS1 to SS16 with different head positions from the 16-byte character string "Alice was beginn" input in the cycle C and the 16-byte character string "ing to get very" input in the cycle (C+1).

The conflict of character strings occurs with respect to match information items selected in one cycle, and also occurs with respect to match information items selected in a cycle and its preceding cycle. When the match selector 74 selects match information in a cycle, it may consider a dictionary match character string of a substring corresponding to match information selected in the preceding cycle. Assume that the dictionary match character string of the substring SS0 corresponding to the match information selected in the preceding cycle (C−1) is, for example, "xxxxxxxxxxxxxdAli", where a symbol "x" represents any matched character. In this character string, "xxxxxxxxxxxxd" is a character string input in the cycle (C−1) and "Ali" is a character string input in the cycle C. Since the match information of the substring SS0 affects the selection of match information in the next cycle, the substring SS0 is also referred to as a carry-over substring. The match length (=3) in the match information M[0] of the substring SS0 relating to the character string input in the cycle C is referred to as a carry-over length.

If, in this case, the match information M[1] of the first substring SS1 is selected in the cycle C, a character "A" is overlapped in the dictionary match string "Axxxxxxxxxxxxxxxx" of the first substring SS1 and the dictionary match string "xxxxxxxxxxxxdAli" of the substring SS0.

If, however, the match information M[4] of the substring SS4 is selected in the cycle C, no character is overlapped in the dictionary match character string "ce_w************" of the substring SS4 and the dictionary match character string "xxxxxxxxxxxdAli" of the substring SS0. A conflict of the character strings is avoided.

As described above, in the selection of match information, the head position of a substring corresponding to match information to be selected in the current cycle differs depending on a result of selection of match information in the preceding cycle. The head position of the substring is determined by the carry-over length. If, therefore, the carry-over length is not determined, no selection of match information can be started. It is thus necessary to select match information in one cycle in order to perform a pipeline process without stalling.

Figure 7:
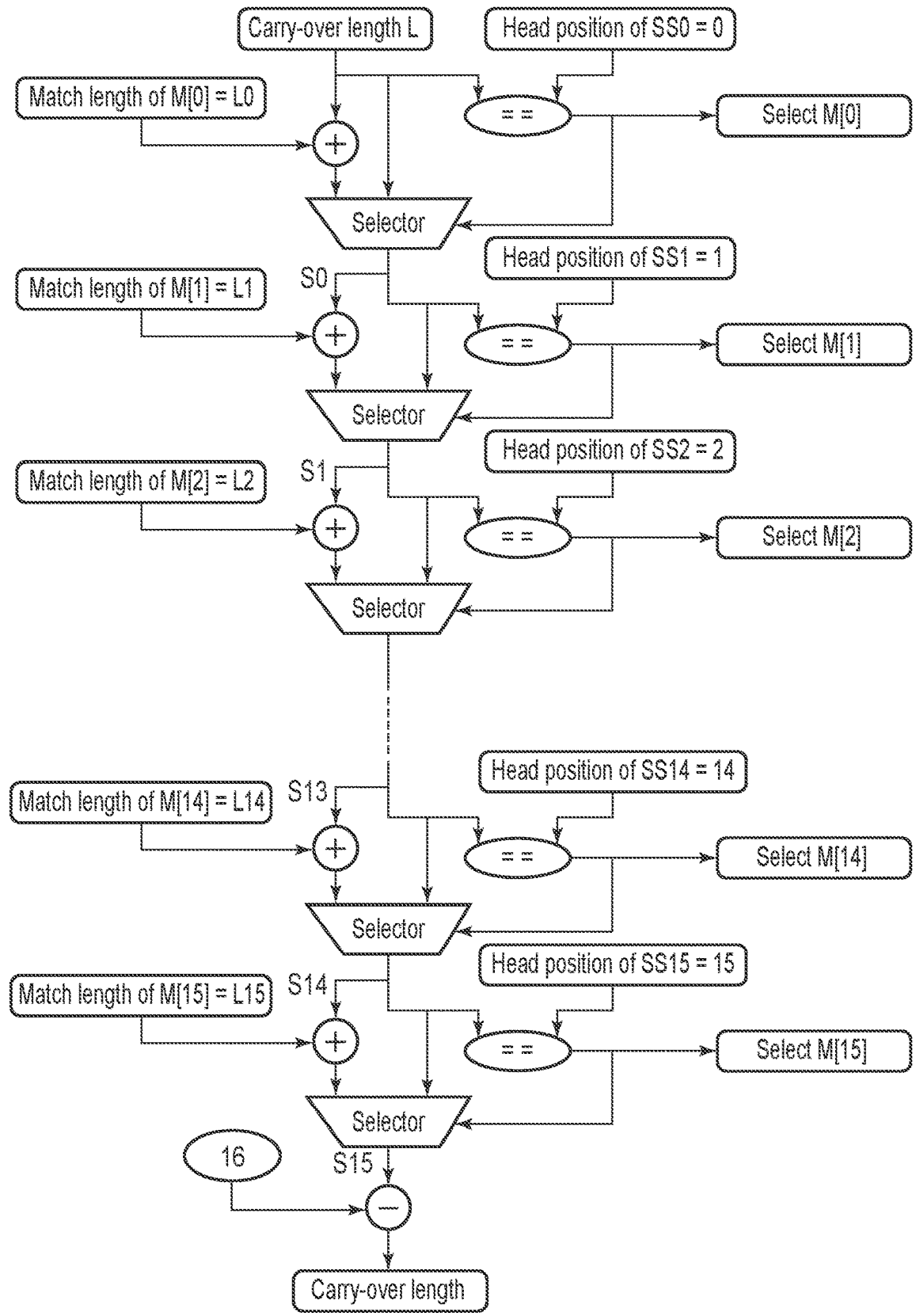
FIG. 7 is a diagram illustrating an example of a match selection circuit according to the embodiment.

An example of hardware that selects match information using a carry-over length in accordance with the foregoing reference is shown in FIG. 7. FIG. 7 is a diagram illustrating an example of a match selection circuit according to the example. This selection circuit adds up the match lengths of respective items of the match information M[i] to determine whether to select the match information.

In order to determine whether to select the match information M[0] of the substring SS0, the carry-over length L and the head position of the substring SS0 are compared. The head position of the substring SS0 is 0. In FIG. 7, the substring SS0 represents a substring generated from the input data of the current cycle.

If the carry-over length L and the head position of substring SS0 match, the match information M[0] is selected. Also, if they match, a selector outputs a result of the addition of the carry-over length L and the match length L0 of M[0] as a signal S0 for determining whether or not to select the match information M[1] of next substring SS1.

If they do not match, the match information M[0] is not selected. Also, if they do not match, the selector outputs the value of the carry-over length L as the signal S0.

In order to determine whether to select the match information M[1] of the substring SS1, the head positions of the signal S0 and the substring SS1 are compared to each other. The head position of the substring SS1 is 1.

If both the head positions match, the match information M[1] is selected. Also, if they match, the selector outputs a result of addition of the signal S0 and the match length L1 of M[0] as a signal S1 for determining whether to select the match information M[2] of next substring SS2.

If both the head positions do not match, the match information M[1] is not selected. Also, if they do not match, the selector outputs the value of the signal S0 as the signal S1.

After that, a process similar to the above is performed for the match information M[3] of the substring SS3 through the match information M[15] of the substring SS15. The result of addition of signal S15 and the length of the substring "16" is defined as a carry-over length L to the next cycle.

In the foregoing circuit, however, adders are connected in sequence to make a path longer. Therefore, the operating frequency is likely to lower if it is implanted by hardware. In addition, a carry-over length must be determined in one cycle, a process cannot be divided into a plurality of stages.

Figure 8:
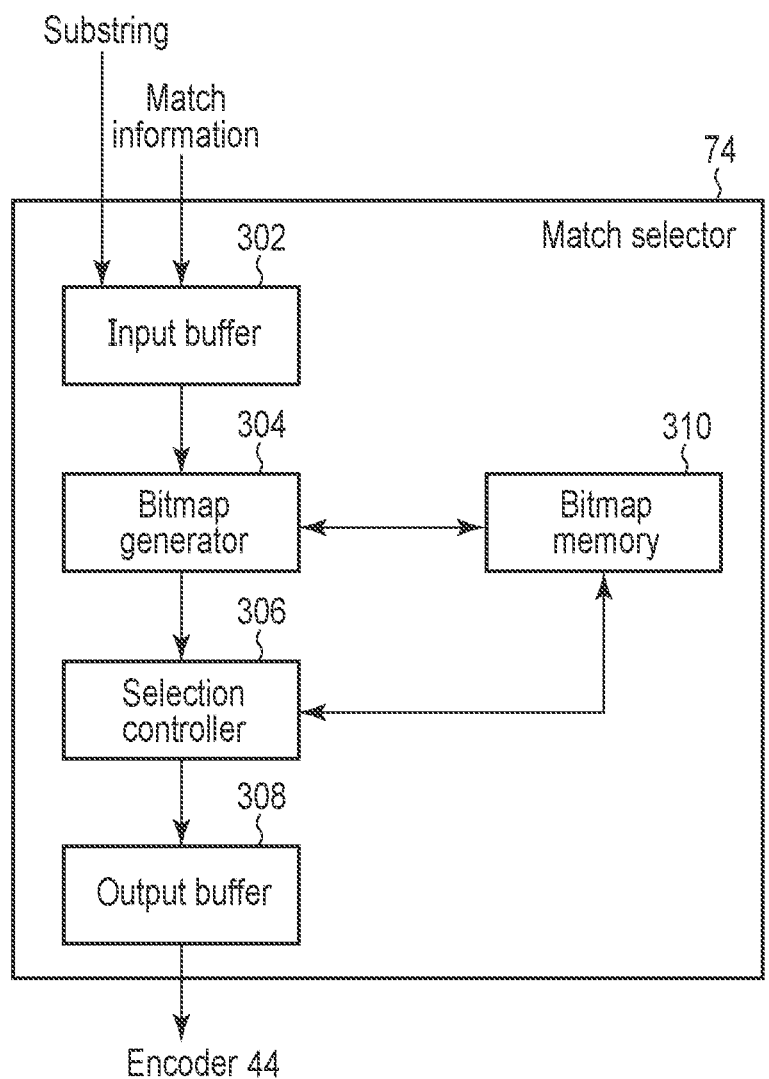
FIG. 8 is a block diagram illustrating an example of the match selector according to the embodiment.

FIG. 8 is a block diagram illustrating an example of the match selector 74 according to the embodiment. The match selector 74 includes an input buffer 302, a bitmap generator 304, a bitmap memory 310, a selection controller 306, and an output buffer 308. The substring output from the substring generator 62 and the match information output from the match information generator 70 are written to the input buffer 302. The bit map generator 304 converts the match information, which is written to the input buffer 302, into a bitmap, and writes the bitmap to the bitmap memory 310. The bit map generator 304 transmits the match information to the selection controller 306. The selection controller 306 reads the bitmap from the bit map memory 310 to determine whether to select the match information based on the bit map. The selection controller 306 writes the selected match information to the output buffer 308. The match information stored in the output buffer 308 is transmitted to the encoder 44.

Figure 9:
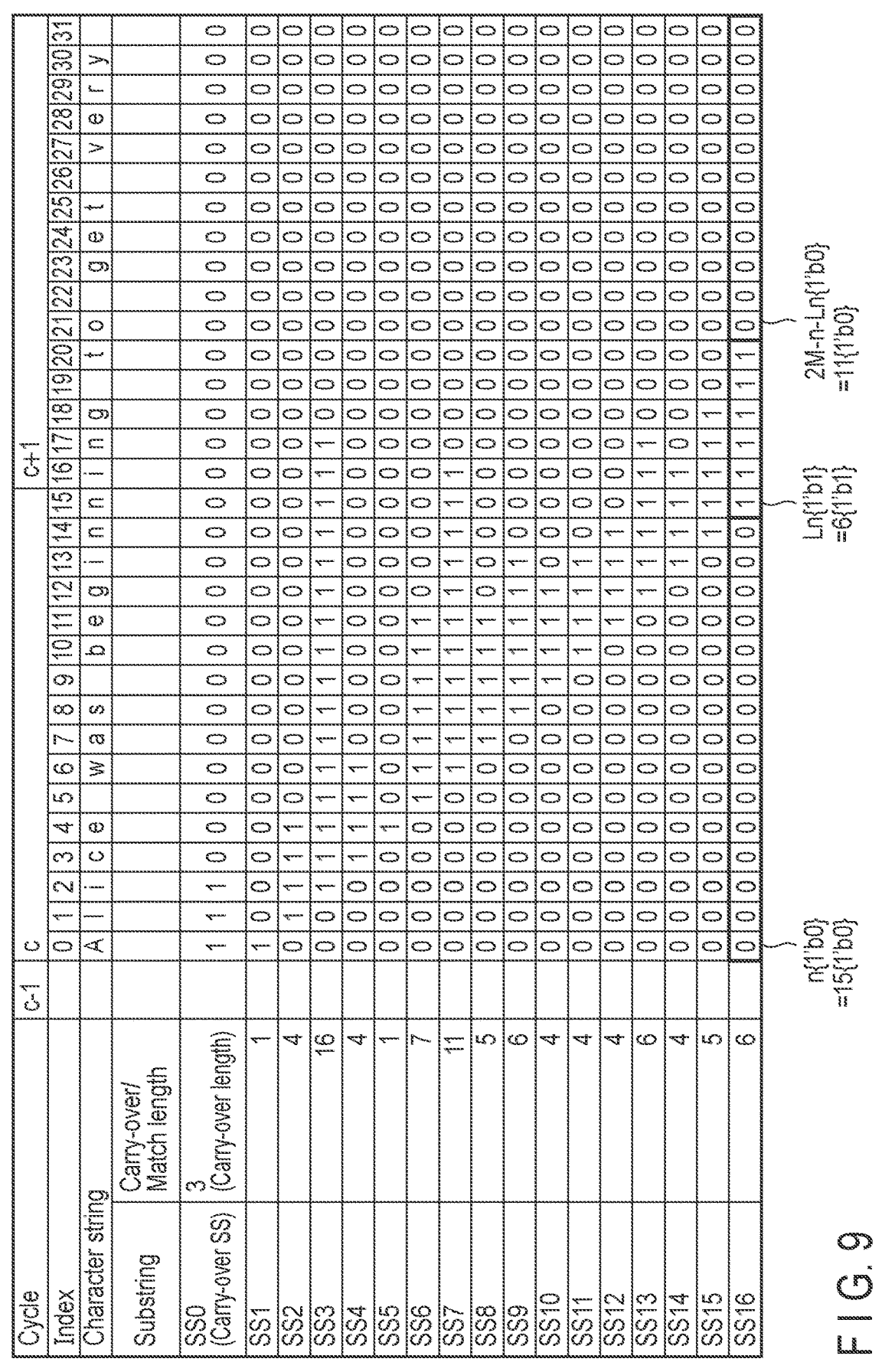

FIG. 9 is a diagram illustrating an example of a bitmap of match information generated by the bit map generator 304 according to the embodiment. The bitmap shows whether a substring and a character string in the history buffer 68 has matched or not for each byte position of the input character string. FIG. 9 shows a bitmap in which the matched character is represented by 1 and the other is represented by 0 in the dictionary match character string shown in FIG. 6.

Bitmap BPn of the n-th substring SSn is represented as follows.

If n is equal to 0 (carry-over substring SS0), BPn is given by Equation 1A.

$$BPn=\{\{L0\{1'b1\}\},\{(2M-L0)\{1'b0\}\}\} \quad \text{Equation 1A}$$

In the Equation 1A, L0 is the carry-over length.

If n is equal to 1 through N, BPn is given by Equation 1B.

$$BPn=\{\{(n-1)\{1'b0\}\},\{Ln\{1'b1\}\},\{(2M-(n-1)-Ln)\{1'b0\}\}\} \quad \text{Equation 1B}$$

In the Equation 1B, Ln is the match length of the match information of the substring n, and M is the maximum match length that is length 16 of the substring.

Bitmap BP16 of SS16 is given by Equation 2.

The match length Ln of the match information of the substring 16 is 6.

$$BP16=\{\{15\{1'b0\}\},\{6\{1'b1\}\},\{11\{1'b0\}\}\} \quad \text{Equation 2}$$

The notation of symbols used in this specification will be described below.

(1) 1'b0 represents 1 bit and its value is 0.
(2) 1'b1 represents 1 bit and its value is 1.
(3) $\{n\{1'b0\}\}$ is obtained by repeating "1'b0" n times and concatenating them.

EXAMPLE $$\{n\{1'b0\}\}=\{0,0,\ldots,0\} \quad \text{Equation 3}$$

For bit string $\{b_0, b_1, b_2, \ldots, b_{N-2}, b_{N-1}\}$, Equations 4, 5, and 6 are given as follows ($b_n$ (n=0, 1, ..., N−1)

represents 1 bit, $b_0$ is MSB, $b_{N-1}$ is LSB, and $b_0, b_1, b_2, \ldots, b_{N-2}, b_{N-1}$ are concatenated).

$$B[n]=b_{N-1-n} \qquad \text{Equation 4}$$

$$B[n:0]=\{b_{N-1-n}, b_{N-1-n+1}, b_{N-1-n+2}, \ldots, b_{N-2}, b_{N-1}\} \qquad \text{Equation 5}$$

If n is equal to 0 in the notation of Equation 5, then $B[0:0]$ is equal to $b_{N-1}$.

$$B[0:n]=\{b_0, b_1, b_2, \ldots, b_n\} \qquad \text{Equation 6}$$

If n is equal to 0 in the notation of Equation 6, then $B[0:0]$ is equal to $b_0$).

(4) For bit string A $n=\{a_0, a_1, a_2, \ldots, a_{n-2}, a_{n-1}\}$ and bit string $B_n=\{b_0, b_1, b_2, \ldots, b_{n-2}, b_{n-1}\}$, Equations 7 and 8 are given as follows.

The operator & (or |) is placed between the bit strings, Equation 7 is given as follows.

$$A_n \& B_n = \{b_0 \& a_0, b_1 \& a_1, b_2 \& a_2, \ldots, b_{n-2} \& a_{n-2}, b_{n-1} \& a_{n-1}\} \qquad \text{Equation 7}$$

$A_n \& B_n$ is n bits that are AND (or OR) of bits of the bit strings $A_n$ and $B_n$.

The operator & (or H is placed at the head of the bit string, Equation 8 is given as follows.

$$\& A_n = a_0 \& a_1 \& a_2 \ldots \& a_{n-2} \& a_{n-1} \qquad \text{Equation 8}$$

$\& A_n$ is 1 bit that is AND (or OR) of bits of the bit string $A_n$.

(5) The negation operator is represented by "~".

EXAMPLE $\sim(1'b1) = 1'b0$

Figure 10:
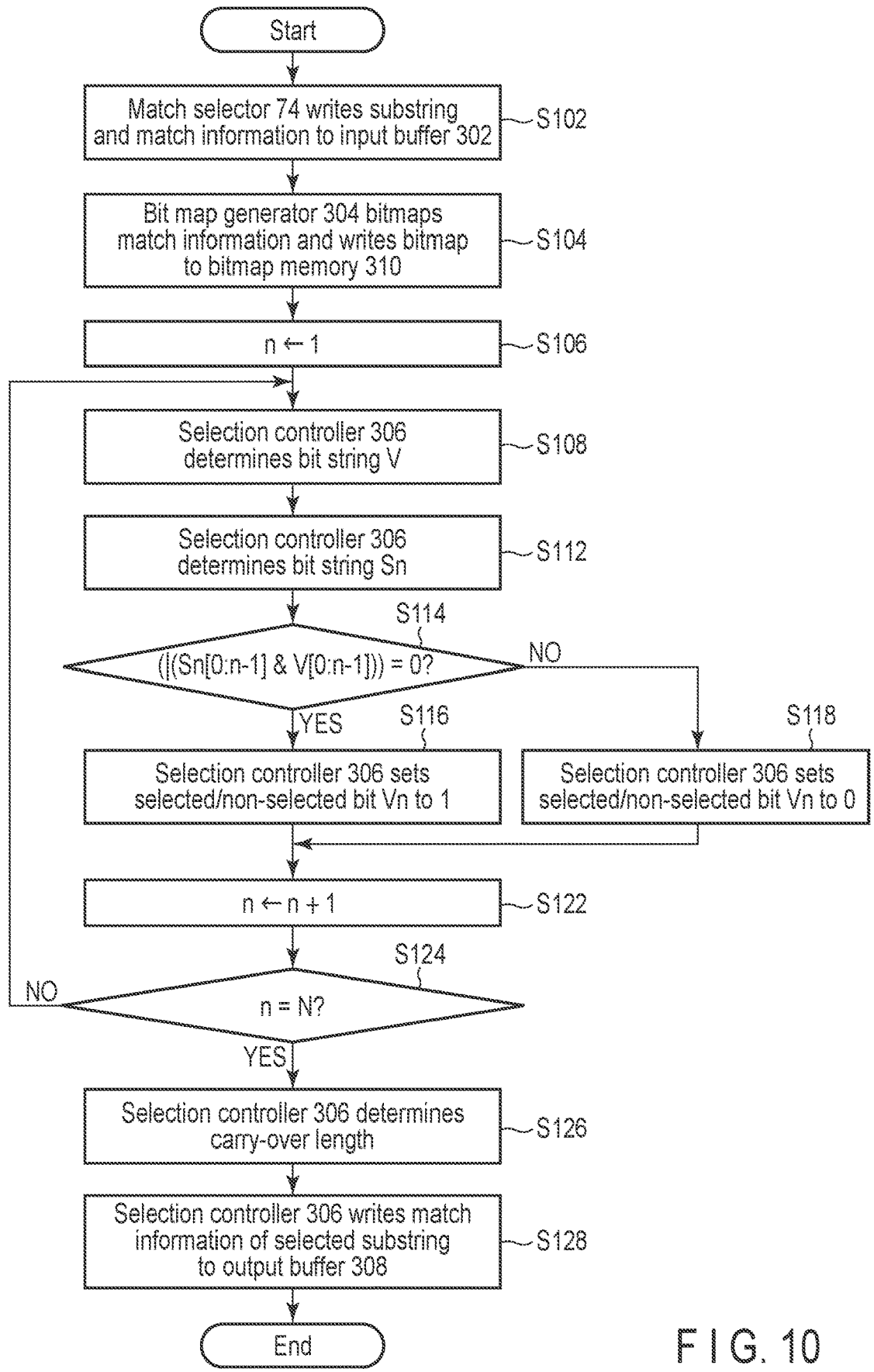
FIG. 10 is a flowchart illustrating an example of a process of the match selector according to the embodiment.

FIG. 10 is a flowchart illustrating an example of a process of the match selector 74 according to the embodiment.

The match selector 74 writes N substrings and N items of match information to the input buffer 302 (S102).

The bit map generator 304 bitmaps the match information of N substrings and writes bitmap BP (Equation 1A or 1B) to the bitmap memory 310 (S104).

The selection controller 306 sets variable n to 1 (S106).

The selection controller 306 determines bit string V (S108).

Bit string V is a set of selected/non-selected bits Vn representing whether match information M[n] of the n-th substring is selected or not, as given by Equation 9.

$$V=\{V_0, V_1, \ldots, V_N\} \qquad \text{Equation 9}$$

If match information M[n] of the n-th substring is selected, Vn is equal to 1. If it is not selected, Vn is equal to 0. Since match information M[0] of carry-over substring SS0 is always selected, the selected/non-selected bit $V_0$ of the carry-over substring SS0 is 1.

The selection controller 306 determines bit string Sn (S112) as given by Equation 10.

$$Sn=\{BP_0[2M-1-n], BP_1[2M-1-n], \ldots, BP_N[2M-1-n]\} \qquad \text{Equation 10}$$

The bit string $S_n$ is a bit string of substrings whose numbers are smaller than that of a substring to be determined with respect to the bit position of the head position of the substring to be determined. The smaller number substrings also include carry-over substrings.

The selection controller 306 determines whether a determination bit ($|(S_n[0:n-1] \& V[0:n-1]))$ is 0 (S114).

If the determination bit ($|(S_n[0:n-1] \& V[0:n-1]))$ is 0 (YES in S114), the selection controller 306 sets selected/non-selected bit Vn to 1 (selects the match information of SSn) (S116). Since the match information M[0] of the carry-over substring SS0 is always selected, the determination bit of the carry-over substring SS0 is 1.

If the determination bit ($|(S_n[0:n-1] \& V[0:n-1]))$ is 1 (NO in S114), the selection controller 306 sets the selected/non-selected bit Vn to 0 (does not select match information of SSn) (S118).

The selection controller 306 adds 1 to the variable n (S122).

The selection controller 306 determines whether the variable n has reached N (S124). If the variable n has not reached N (NO in S124), the selection controller 306 again performs the process of determining the bit string V (S108).

If the variable n has reached N (YES in S124), the selection controller 306 determines a carry-over length to the next cycle (S126). The selection controller 306 sets, as a carry-over length, a value obtained by subtracting M from "(match position−1)+match length)" of substring n in which Vn=1 and n is the largest. If, for example, SS6 has the largest match length and its value is 14, the carry-over length is 6−1+14−16=3. The selection controller 306 writes the carry-over length to the bitmap memory 310. The carry-over length is added to the bitmap when the bitmap in the next frame is generated, as shown in FIG. 9.

The selection controller 306 writes the match information of the selected substring to the output buffer 308 (S128). The match information stored in the output buffer 308 is transmitted to the encoder 44.

Thus, the match selector 74 according to the embodiment can select the match information to prevent character strings to be compressed from overlapping. Furthermore, the selection controller 306 determines whether to select the match information of a substring to be determined, based on 1-bit AND operation and 1-bit OR operation with respect to the bit position of a head position of a substring to be determined on the bitmap of the match information. The 1-bit AND operation or the 1-bit OR operation relates to a specific bit string which is a string of bits of a substring with a number smaller than that of a substring to be determined and a bit string representing whether the match information of the substring with a number that is smaller than that of the substring to be determined is selected. Thus, the selection controller 306 can select match information and calculate the carry-over length at high-speed. Therefore, the match selection process can also be pipelined.

A specific example of match selection according to the flowchart will be described with reference to FIGS. 11, 12, and 13.

FIG. 11 shows the status of the bit string V, the bit string Sn, and the determination bit in determining (n=1) whether or not to select the match information M[1] of the first substring SS1. The bit string V is equal to $\{V_0\}$ and $\{1\}$. Since the bit string Sn is equal to $\{1\}$, the determination bit ($|(Sn[0:n-1] \& V[0:n-1]))$ is equal to 1. Therefore, the match information M[1] is not selected and $V_1$ is equal to 0.

FIG. 12 shows the status of the bit string V, the bit string Sn, and the determination bit in determining (n=2) whether or not to select the match information M[2] of the second substring SS2. The bit string V is equal to $\{V_0, V_1\}$ and $\{1, 0\}$. Since the bit string $S_n$ is equal to $\{1, 0\}$, the determination bit ($|(Sn[0:n-1] \& V[0:n-1]))$ is equal to 1. Therefore, the match information M[2] is not selected, and $V_2$ is equal to 0.

Similarly, the match information M[3] is not selected, and $V_3$ is equal to 0.

Figure 13:
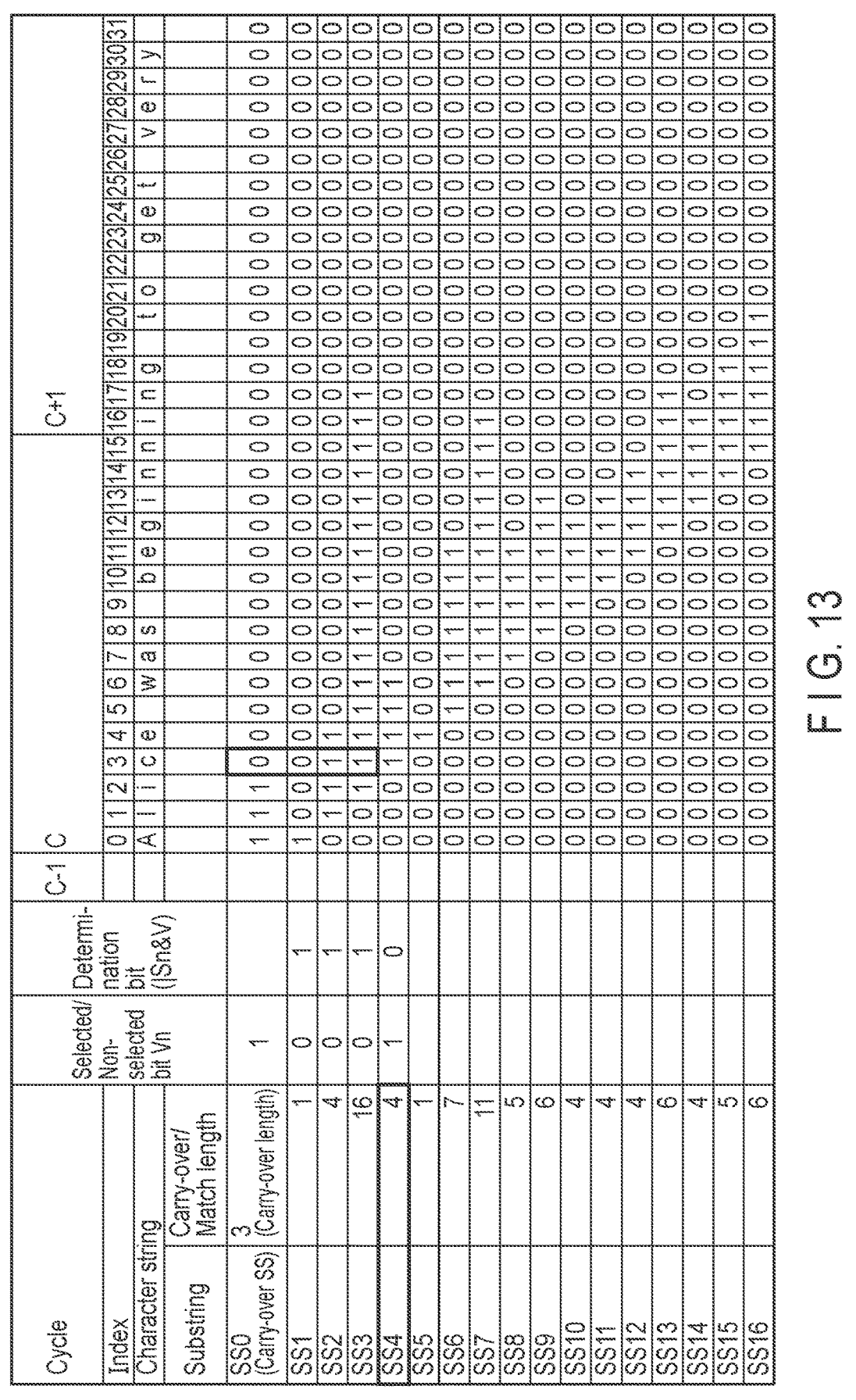

FIG. 13 shows the status of the bit string V, the bit string $S_n$, and the determination bit in determining (n=4) whether or not to select the match information M[4] of the fourth substring SS4. The bit string V is equal to $\{V_0, V_1, V_2, V_3\}$ and $\{1, 0, 0, 0\}$. Since the bit string $S_n$ is equal to $\{0, 0, 1, 1\}$, the determination bit $(|(S_n[0:n-1]\&V[0:n-1]))$ is equal to 0. Therefore, the match information M[4] is selected, and $V_4$ is equal to 1.

Although not shown in FIG. 13, it is expected that the match information M[4] of the fourth substring SS4 is selected and then the match information M[8] of the eighth substring SS8 is selected. The selection determination made when n is equal to 8 will be described. V is equal to $\{V_0, V_1, V_2, V_3, V_4, V_5, V_6, V_7\}$ and $\{1, 0, 0, 0, 1, 0, 0, 0\}$. The bit string Sn is equal to $\{0, 0, 0, 1, 0, 0, 1, 1\}$. $|(Sn[0:n-1]\&V[0:n-1])$ is equal to $|8'b00010011\&8'b10001000$, $|8'b00000000$, and $1'b0$. Therefore, the match information M[8] is selected.

There is an algorithm, such as Lazy match, which improves the efficiency of match information selection by shortening the match length during the match information selection. An example of the simplest approach to the Lazy match is an algorithm in which the match length of the substring SSn and that of the substring SS(n+1) are compared, and if the match length of the substring SS(n+1) is greater, match selection is performed with the match length of the substring SSn set to 1. If a bitmap is generated using such an algorithm, the match length of the corresponding substring has only to be compared with that of its subsequent substring, and if the match length of the subsequent substring is greater, the match length of the subsequent substring has only to be set to 1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A compression device comprising:
   a substring generator configured to receive data strings for cycles, a data string per cycle having certain bytes, and generate substrings from the data strings, each of the substrings having the certain bytes, each of the substrings including different byte data, leading byte positions of different byte data of the substrings being different from each other;
   a memory configured to store the data strings for cycles;
   a match information generator configured to determine first data strings in the data strings stored in the memory, at least part of the first data string matching at least part of the substring, and generate match information items, the match information item including a position of the memory storing the first data string and a length of the part of the first data string matching the part of the substring; and
   a selector configured to determine whether to select a second item of the match information items based on bitmaps of the match information items and a bit string representing whether a first item of the match information items is selected, wherein:
   the data string per cycle has M bytes;
   the number of the substrings is N;
   the length of the part of the first string matching the part of n-th substring is L bytes;
   the selector is configured to generate the bitmap based on M, N, L, and n; M, N, L, and n are positive integers;
   selector is configured to:
      generate a bitmap BPn of the match information of the nth substring, BPn represented by $\{\{L0\{1'b1\}\}, \{(2M-L0)\{1'b0\}\}\}$ if n=0, and BPn represented by $\{\{(n-1)\{1'b0\}\}, \{Ln(1'b1)\}, \{(2M-(n-1)-Ln)\{1'b0\}\}\}$ if n=1 to N; and
      determines whether to select the second item of the match information items of the nth substring in accordance with information Vn representing whether the first items of the match information items of 0th to (n-1)th substrings are selected,
   wherein:
   the 0th substring is an Nth substring of the preceding cycle;
   the information Vn is $(|Sn[0:n-1] \& V[0:n-1])$;
   V represents whether the first items of the match information items of the 0th to (n-1)th substrings are selected;

$$V=\{V_0, V_1, \ldots V_N\};$$

$V_0$ is 1; and $$S_n=\{BP_0[2M-1-n], BP_1[2M-1-n], \ldots, BP_{N-1}[2M-1-n]\}.$$

2. The compression device of claim 1, wherein the selector is configured to determine whether to select the second item in a certain cycle based on the bit maps, the bit string, and the length included in the match information item selected in a cycle preceding the certain cycle.

3. The compression device of claim 1, further comprising:
   an encoder configured to code the first data string based on the second item which is determined by the selector to be selected and to generate compressed data.

4. A memory system comprising:
   a compression device of claim 3;
   a nonvolatile memory; and
   a control circuit configured to write data based on the compressed data generated by the compression device to the nonvolatile memory.

5. A compression method comprising:
   receiving data strings for cycles, a data string per cycle having certain bytes;
   generating substrings from the data strings, each of the substrings having the certain bytes, each of the substrings including different byte data, leading byte positions of different byte data of the substrings being different from each other;
   storing the data strings for cycles into a memory;
   determining first data strings in the data strings stored in the memory, at least part of the first data string matching at least part of the substring;
   generating match information items, the match information item including a position of the memory storing the first data string and a length of the part of the first data string matching the part of the substring; and
   determining whether to select a second item of the match information items based on bitmaps of the match information items and a bit string representing whether a first item of the match information items is selected, wherein:
the data string per cycle has M bytes;
the number of the substrings is N;
the length of the part of the first string matching the part of n-th substring is Ln bytes;
the bitmap is based on M, N, Ln, and n;
M, N, Ln, and n are positive integers;
a bitmap BPn of the match information of the nth substring is represented by {{L0{1'b1}}, {(2M−L0){1'b0}}} if n=0;
the bitmap BPn is represented by {{(n−1){1'b0}}, {Ln(1'b1)}, {(2M—(n−1)−Ln){1'b0}}} if n=1 to N; and
whether to select the second item of the match information items of the nth substring is determined in accordance with information Vn representing whether the first items of the match information items of 0th to (n−1)th substrings are selected;
the 0th substring is an Nth substring of the preceding cycle;
the 0th substring is an Nth substring of the preceding cycle;
the information Vn is (|(Sn[0:n−1] & V [0:n−1]));
V represents whether the first items of the match information items of the 0th to (n−1)th substrings are selected;

$V=\{V_0, V_1, \ldots V_N\}$;

$V_0$ is 1; and $Sn=\{BP0\ [2M-1-n], BP1\ [2M-1-n], \ldots, BP_{N-1}\ [2M-1-n]\}$.

6. The compression method of claim 5, wherein determining whether to select the second item is further depends on the length included in the match information item selected in a cycle preceding the certain cycle.

7. A compression device comprising:
a substring generator configured to receive input data strings for cycles, an input data string per cycle having certain bytes, and generate substrings from the input data strings, each of the substrings having the certain bytes, each of the substrings including different byte data, leading byte positions of different byte data of the substrings being different from each other;
a memory configured to store the input data strings for cycles;
a match information generator configured to determine first data strings in the data strings stored in the memory, at least part of the first data string matching at least part of the substring, and generate match information items, the match information item including a position of the memory storing the first data string and a length of the part of the first data string matching the part of the substring; and
a selector configured to determine whether to select a second item of the match information items based on a result of 1-bit OR operation for a result of 1-bit AND operation for a bit string Sn and a bit string V, wherein the bit string Sn represents bitmaps of the match information items for substrings;
the bitmap for the substring shows whether the substring matches or not the first data string for each byte position of the input data string; and
the bit string V represents whether a first item of the match information items is selected.

8. The compression device of claim 7, wherein:
the selector is configured to determine whether to select the second item of the match information items based on 1-bit AND operation and 1-bit OR operation with respect to a bit position of a head position of a substring to be determined on the bitmaps of the match information items.

9. The compression device of claim 8, wherein:
the 1-bit AND operation or the 1-bit OR operation relates to a specific bit string which is a string of bits of a substring with a number smaller than that of the substring to be determined and a bit string representing whether the match information items of the substring with a number that is smaller than that of the substring to be determined.

10. The compression device of claim 7, wherein:
the selector comprises 1-bit calculators, each of the 1-bit calculators calculates an AND operation or an OR operation.

11. The compression device of claim 7, wherein:
the input data string per cycle has M bytes;
the number of the substrings is N;
the length of the part of the first string matching the part of n-th substring is L bytes;
M, N, L, and n are positive integers; and
the selector is configured to generate the bitmap based on M, N, L, and n.

12. The compression device of claim 11, wherein the selector is configured to:
generate a bitmap BPn of the match information items of the nth substring, BPn represented by {{L0{1'b1}}, {(2M−L0){1'b0}}} if n=0, the bitmap BPn is represented by {{(n−1){1'b0}}, {Ln(1'b1)}, {(2M—(n−1)−Ln){1'b0}}} if n=1 to N; and
determines whether to select the second item of the match information items of the nth substring in accordance with information Vn representing whether the first items of the match information items of 0th to (n−1) th substrings are selected, wherein:
the 0th substring is an Nth substring of the preceding cycle;
the information Vn is (|(Sn[0:n−1] & V [0:n−1]));
V represents whether the first items of the match information items of the 0th to (n−1)th substrings are selected;

$V=\{V_0, V_1, \ldots V_N\}$;

$V_0$ is 1; and $Sn=\{BP0\ [2M-1-n], BP1\ [2M-1-n], \ldots, BPN-1\ [2M-1-n]\}$.

* * * * *